US008049244B2

(12) United States Patent
Chen et al.

(10) Patent No.: US 8,049,244 B2
(45) Date of Patent: Nov. 1, 2011

(54) PACKAGE SUBSTRATE AND LIGHT EMITTING DEVICE USING THE SAME

(75) Inventors: Chih-Ming Chen, Hsin-Chu Hsein (TW); Cheng-Hung Yang, Hsin-Chu Hsein (TW)

(73) Assignee: Lextar Electronics Corp., Hsinchu (TW)

( * ) Notice: Subject to any disclaimer, the term of this patent is extended or adjusted under 35 U.S.C. 154(b) by 424 days.

(21) Appl. No.: 12/334,476

(22) Filed: Dec. 14, 2008

(65) Prior Publication Data
US 2010/0072492 A1    Mar. 25, 2010

(30) Foreign Application Priority Data
Sep. 25, 2008   (TW) ................................ 97217331 U

(51) Int. Cl.
H01L 33/00    (2010.01)
H01L 33/44    (2010.01)
(52) U.S. Cl. .................. 257/99; 257/E33.067; 257/100
(58) Field of Classification Search .................... 257/99, 257/100, E33.067; 362/364
See application file for complete search history.

(56) References Cited

U.S. PATENT DOCUMENTS

| 2006/0097245 | A1* | 5/2006 | Aanegola et al. ............... 257/26 |
| 2006/0118808 | A1* | 6/2006 | Ishidu et al. .................. 257/100 |
| 2006/0279949 | A1* | 12/2006 | Shin et al. ..................... 362/236 |

FOREIGN PATENT DOCUMENTS
JP          58-222578 A    * 12/1983
* cited by examiner Primary Examiner — Jerome Jackson, Jr.
Assistant Examiner — Paul Budd
(74) Attorney, Agent, or Firm — Liu & Liu

(57) ABSTRACT

A package substrate of the present invention at least comprises a metal substrate and a plurality of light emitting dies. The metal substrate is provided thereon with at least one trench. The trench is recessed into the surface of the metal substrate through an insulating layer. The light emitting dies are secured in the trench and electrically connected to a predetermined wiring layer on the metal substrate by metal wires, thereby obtaining a light emitting die package substrate with good thermal conductivity, high heat dissipation, separate electrical and thermal paths and a simple and firm structure.

17 Claims, 7 Drawing Sheets

PACKAGE SUBSTRATE AND LIGHT EMITTING DEVICE USING THE SAME

BACKGROUND OF THE INVENTION (a) Field of the Invention

The present invention relates to an improvement in a package substrate, and more particularly to a light emitting die package substrate with good thermal conductivity, high heat dissipation, separate electrical and thermal paths and a simple and firm structure, and to an improvement in a package substrate in which the light from the light emitting dies can be reflected by a polished reflective layer to enhance the light availability.

(b) Description of the Prior Art

A chip on board (COB) package for packaging typical dies is a type of integrated circuit package, in which bare dies are directly attached to and packaged on a printed circuit board, or a copper substrate or an aluminum substrate. The combination of three basic manufacturing processes: die attaching, wire connecting and encapsulating can effectively transfer the packaging and testing steps during an IC manufacturing process direct to a circuit board assembly stage. This packaging technology is actually a miniature surface mounting technology.

Metal wires are used to connect the contacts of the dies to the contacts of a circuit board or a substrate to form the electrical connection. The encapsulation technologies are applied to cover the exterior thereof.

For this reason, this chip on board packaging technology has been applied to various consumer electronics, such as multifunction business machines, mobile phones, digital cameras and computers. This is also an important manufacturing process to make various consumer electronics toward miniaturization and multifunctionalization. In particular, a light emitting chip is taken as an example of a chip on board package structure of typical dies. As shown in FIG. 1, there is a cross-sectional side view of the prior art. It is apparent from the figure that in a traditional package structure, light emitting dies 11 are directly positioned on a substrate 12 (for example, a copper substrate, an aluminum substrate or another metal substrate, etc.), and an insulator 13 is applied on the substrate 12. In doing so, conductive segments 14 can be arranged on the insulator 13 of the substrate 12, and wires 15 are electrically connected from the contacts of the light emitting dies 11 to the conductive segments 14 on the insulator 13 by wire bonding. Subsequently, the above light emitting dies 11 and conductive segments 14 are encapsulated to form a chip on board package structure of light emitting dies.

However, such structure still has the drawback of high heat resistance. With increase in the performance of the light emitting dies 11, relatively, they generate heat increasingly. If there is no good way for dissipating the heat generated by and accumulated in the light emitting dies 11, the excessive temperature will lead to electronic ionization and thermal stress in the light emitting dies 11, thus reducing the overall stability and shortening the life of the light emitting dies 11 themselves. Therefore, in order to dissipate the heat to prevent the light emitting dies 11 from overheating, there is proposed a design of the following structure. As shown in FIGS. 2 and 3, there is a cross-sectional side view of another light emitting die package of the prior art. A circuit board 21 in which a metal sheet 22 is embedded as a structure for attaching dies, wire bonding and packaging, comprises a circuit board 21, a metal sheet 22 and light emitting dies 23. The circuit board 21 is provided with corresponding tapered open holes 211, and soldering points 212 are disposed on the surface of the circuit board 21 beside the corresponding holes 211. The soldering points 212 and the circuit board 21 are designed as an electrically connected circuit. The metallic trenches 221 formed by processing the metal sheet 22 are embedded in the corresponding holes 211 of the circuit board 21. The bottom of the metallic trench 221 protrudes from the corresponding hole 211 of the circuit board. The top edge of the metallic trench 221 is provided with openings 222 corresponding to the positions of the soldering points 212 of the circuit board 21 to allow the soldering points 212 to be exposed to air. The light emitting die 23 is attached into the metallic trench 221 followed by wire bonding to electrically connect the light emitting die 23 with the soldering points 212. Finally, the light emitting die 23 and the wires 24 are encapsulated in the metallic trench 221 to complete the light emitting die packaging process.

Nevertheless, there are still many shortcomings in the above light emitting die package structure during use, such as high material cost, difficulty in processing and low yield of final products due to complexity of manufacture and the like.

SUMMARY OF THE INVENTION

In view of the above-mentioned circumstances, the primary objective of the present invention is to solve the aforementioned problems. The present invention provides a light emitting die package substrate with good thermal conductivity, high heat dissipation, separate electrical and thermal paths and a simple and firm structure, and an improvement in a package substrate in which the light from the is light emitting dies can be reflected by a polished reflective layer to enhance the light availability.

To achieve the above objective, a package substrate of the present invention at least comprises: a metal substrate and a plurality of light emitting dies. The metal substrate is provided thereon with at least one trench. The trench is recessed into the surface of the metal substrate through an insulating layer, and a polished reflective layer is disposed on the surface of the trench. The light emitting dies are secured in the trench in an insulating manner and electrically connected to a predetermined wiring layer on the metal substrate by metal wires, thereby obtaining a light emitting die package substrate with good thermal conductivity, high heat dissipation, separate electrical and thermal paths and a simple and firm structure.

DETAILED DESCRIPTION OF THE PREFERRED EMBODIMENTS

Figure 1:
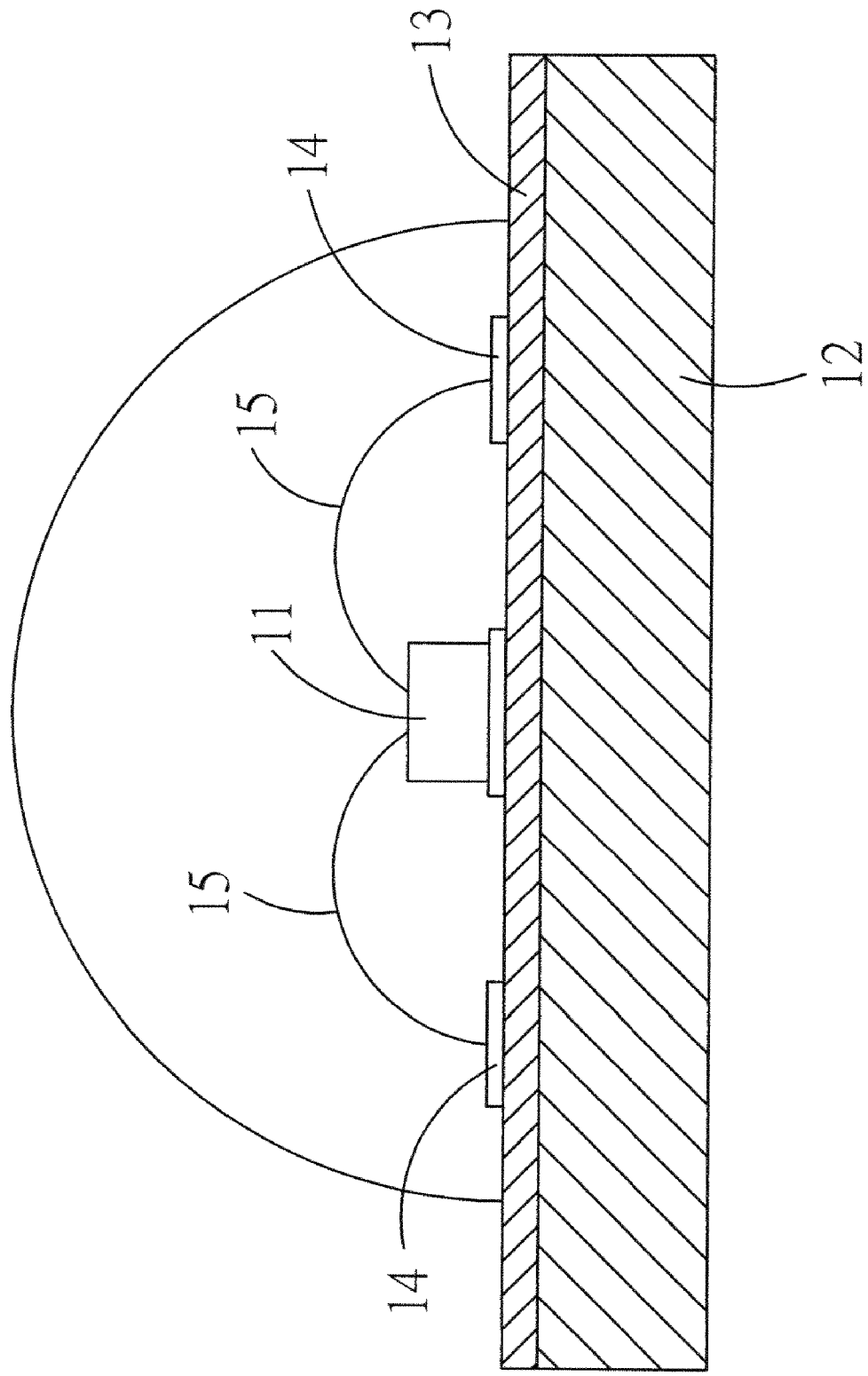
FIG. 1 is a cross-sectional side view of the prior art.
Figure 2:
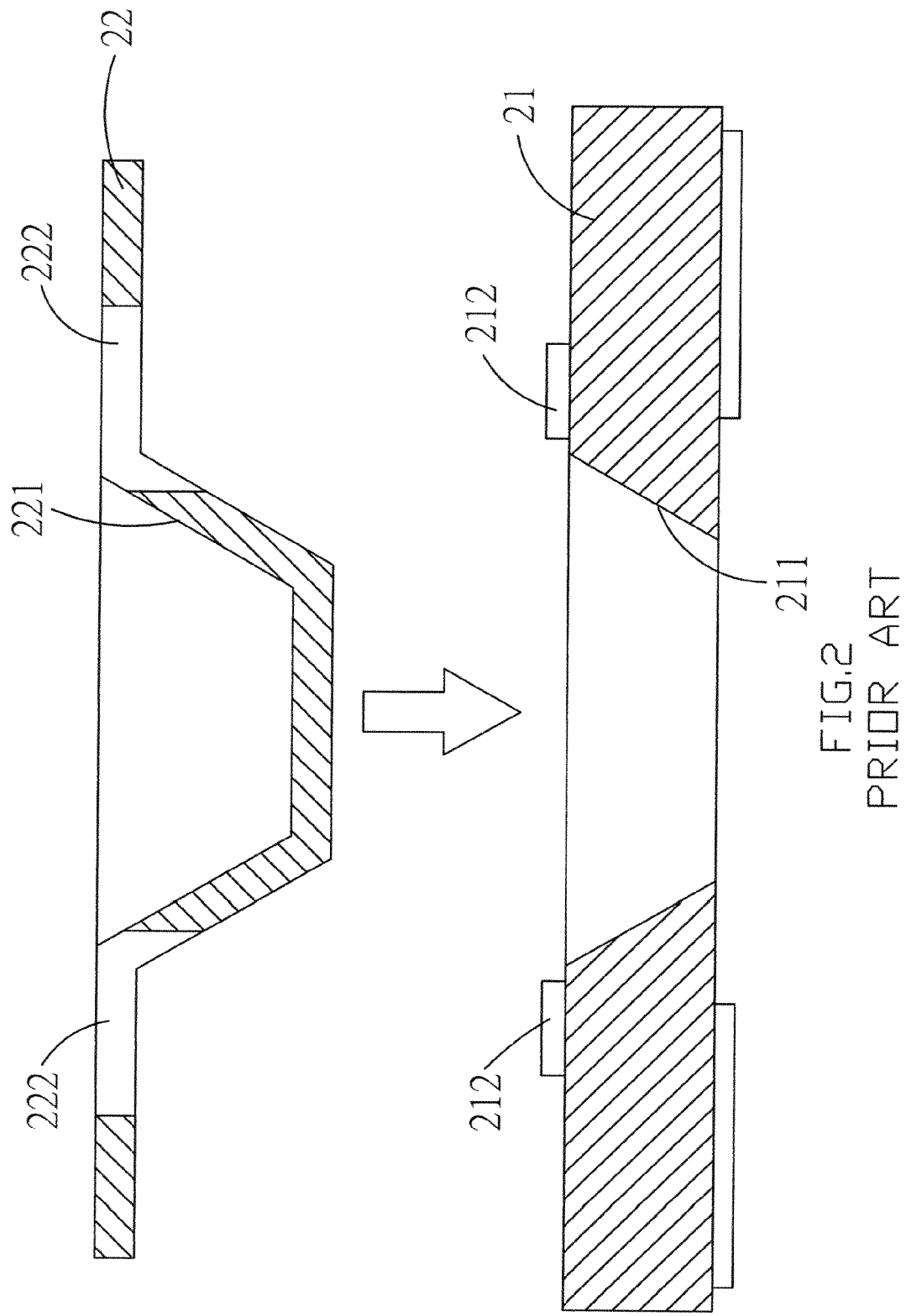
FIG. 2 is a schematic assembly drawing of another light emitting die package of the prior art.
Figure 3:
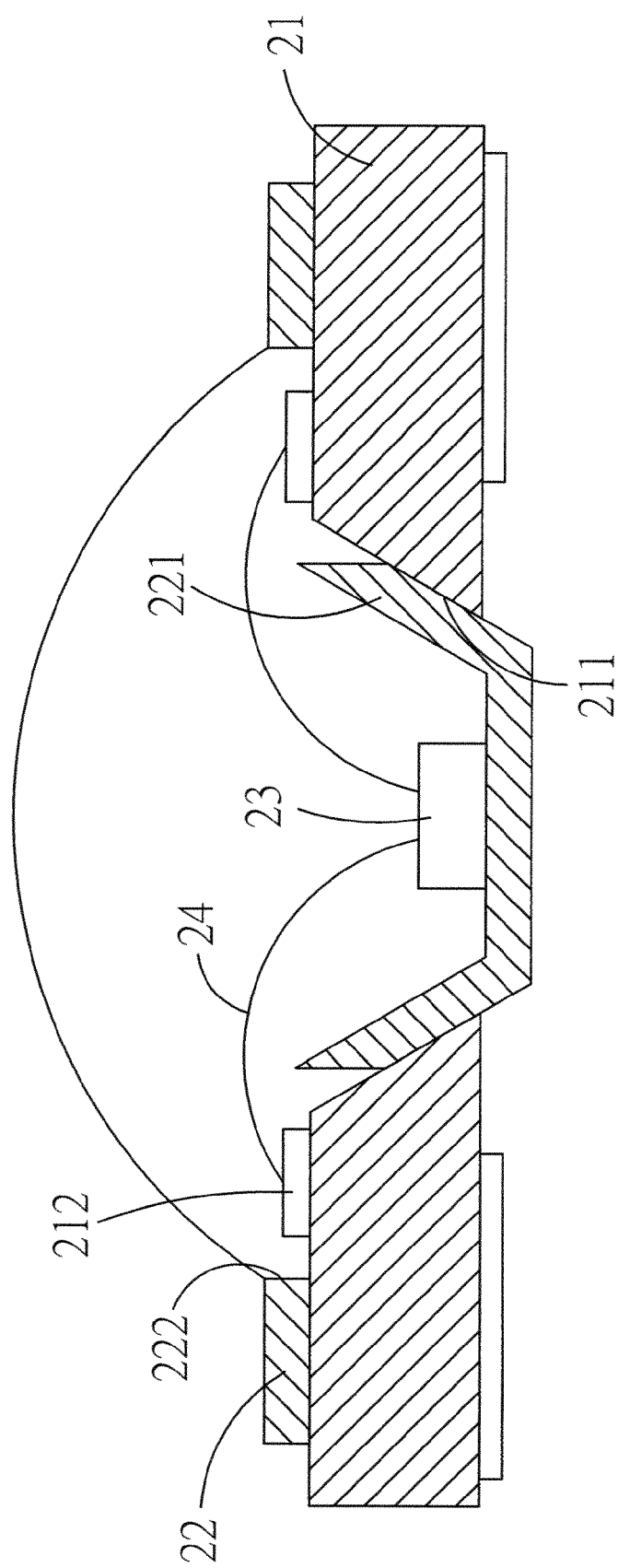
FIG. 3 is a cross-sectional side view of another light emitting die package of the prior art.
Figure 4A:
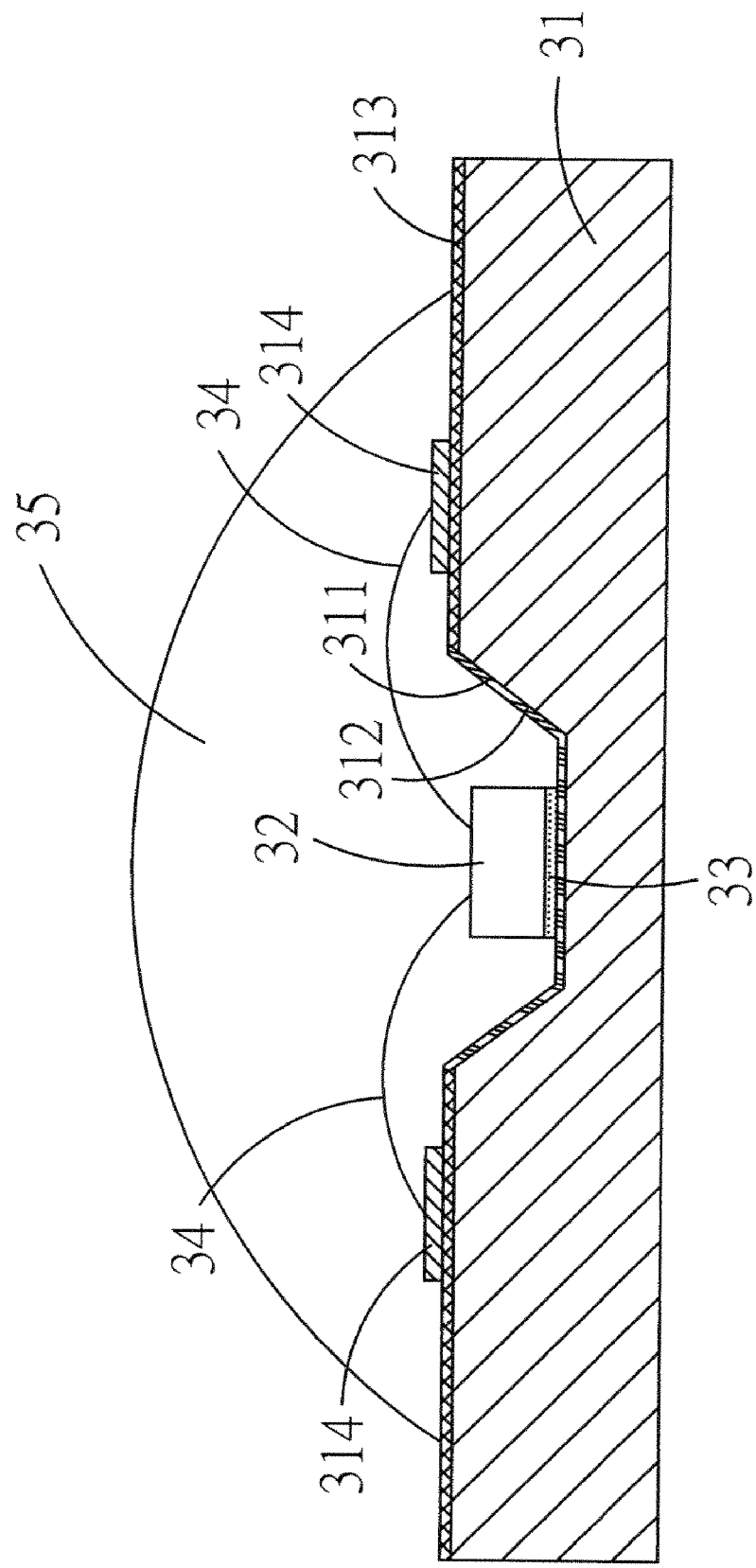
FIGS. 4(A) and (B) are cross-sectional side views of a package substrate according to the present invention.
Figure 5:
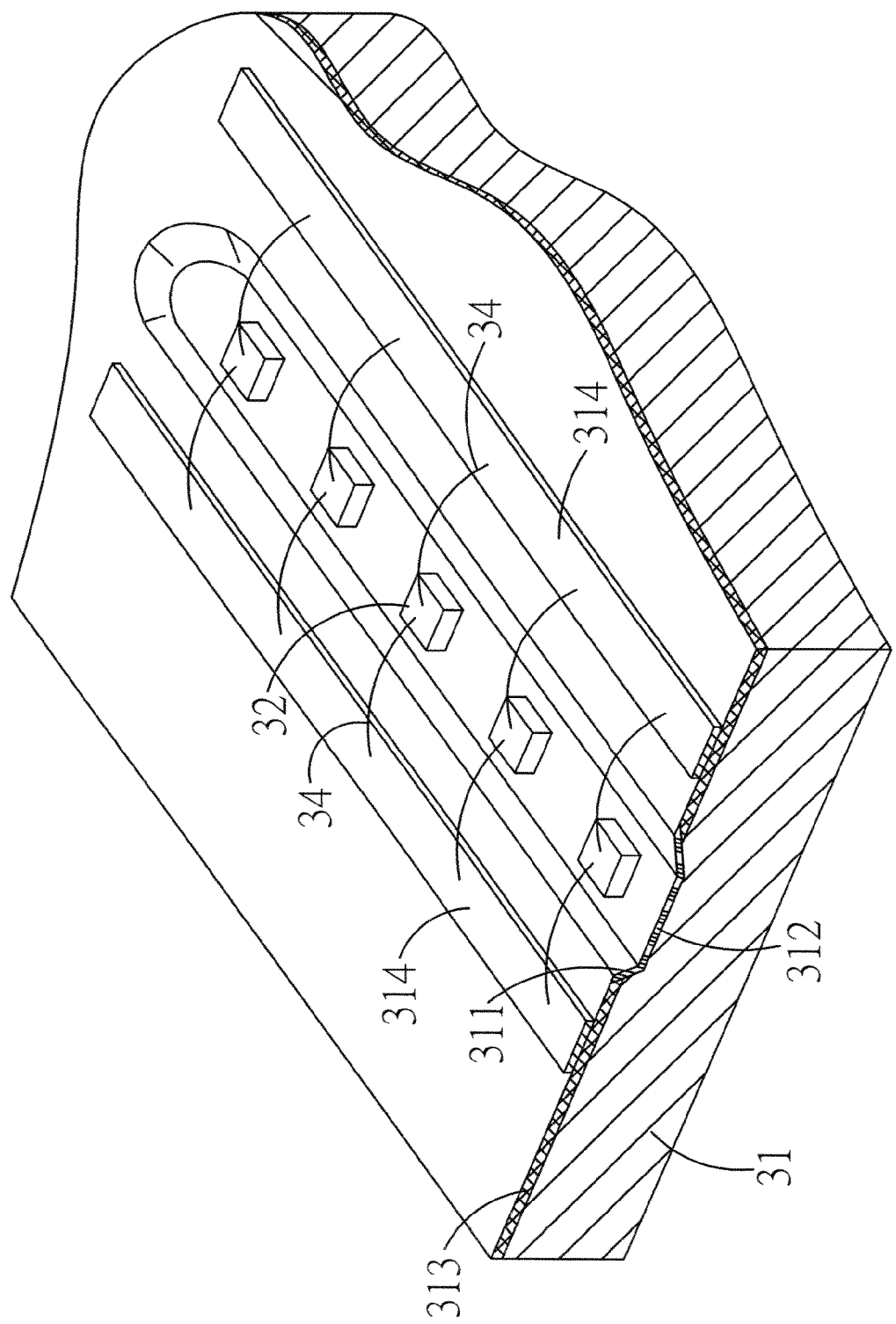
FIG. 5 is a three-dimensional view showing a structure of a package substrate according to the present invention.

The package substrate according to the present invention, as shown in FIGS. 4A and 5, at least comprises:

A metal substrate 31, on the surface of which an insulating layer 313 is disposed, and the metal substrate 31 is provided thereon with at least one trench 311. In the embodiment as shown in the figures, the trench 311 can be in a stripe shape. The trench 311 is recessed into the surface of the metal substrate 31 through the insulating layer 313. The sides of the trench 311 are formed as inclined wall surfaces. The trench 311 can be formed by physical processing (for example, physical machining) or chemical processing (for example, chemical etching), and a polished reflective layer 312 is disposed on the surface of the trench 311. At least one wiring layer 314 is disposed on the insulating layer 313 close to the trench 311. In the figures, there are provided two wiring layers 314 which serve as positive and negative electrodes respectively.

Figure 4B:
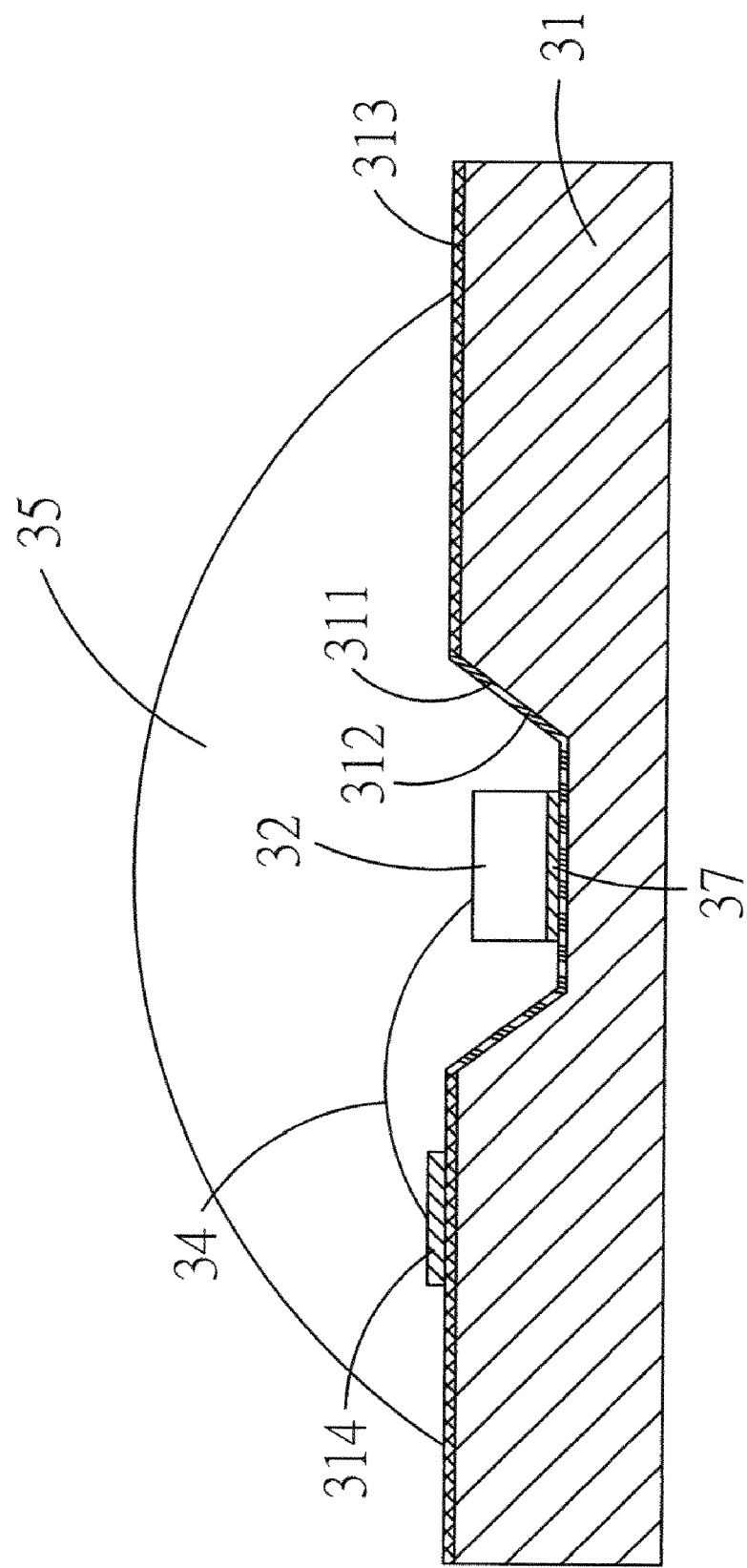

More than one light emitting dies 32, which are secured in the trench 311 in an insulating manner. In the embodiment as shown in the figures, insulating paste 33 is provided between the light emitting dies 32 and the polished reflective layer 312. Metal wires 34 are disposed between the light emitting dies 32 and the wiring layers 314 to form the electrical connection between the light emitting dies 32 and the wiring layers 314. Alternatively, a wiring layer 314 is disposed on the insulating layer 313 close to the trench 311 to serve as one electrode, and the trench 311 is formed as another electrode. The electrodes (not shown) on the bottoms of the light emitting dies 32 are directly electrically connected to the trench 311 in a non-insulating manner, as shown in FIG. 4B. That is to say, conductive paste 37 is provided between the light emitting dies 32 and the polished reflective layer 312 so that the light emitting dies 32 are electrically connected to the trench 311, and metal wires 34 are disposed between the light emitting dies 32 and the wiring layer 314 so as to form the electrical connection between the two electrodes. Naturally, all the light emitting dies 32 can be connected in series or parallel.

Packaging glue 35, which covers all the light emitting dies 32 and the metal wires 34; naturally, the packaging glue 35 can be transparent glue or fluorescent glue or any form that can convert the wavelength.

Therefore, by means of the above structure according to the present invention, a light emitting die package substrate with good thermal conductivity, high heat dissipation, separate electrical and thermal paths and a simple and firm structure is obtained. The light from the light emitting dies can also be reflected by the polished reflective layer to enhance the light availability. Furthermore, the structure of the present invention is simpler than the prior art so that the yield of final products is greatly increased.

Figure 6:
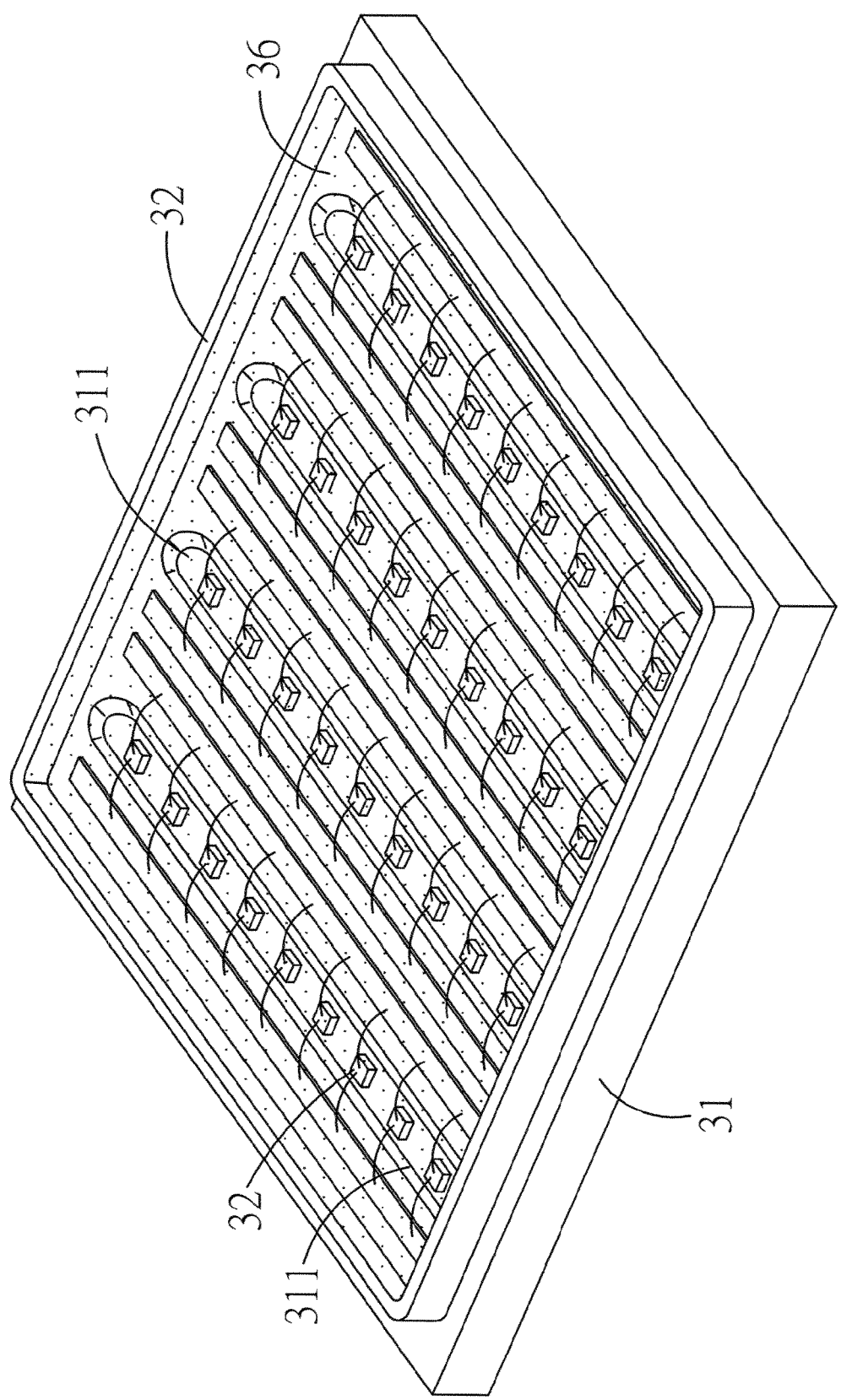
FIG. 6 is a three-dimensional view showing a structure of a light emitting device using a package substrate according to the present invention.

The present invention can also be applied to a light emitting device, as shown in FIG. 6, which similarly comprises metal substrate 31 and a plurality of light emitting dies 32. The metal substrate 31 is provided thereon with a plurality of trenches 311. All the trenches 311 can be arranged in a matrix or in a circular shape. In the figure, a matrix arrangement is taken as an example. At least one enclosure 36 is disposed on the surface of the metal substrate. The enclosure 36 encloses all the trenches 311 and the height of the enclosure 36 is slight higher than that of the light emitting dies 32 and the metal wires 34. Packaging glue 35 is provided in the enclosure 36 to cover all the light emitting dies 32 and the metal wires 34. Naturally, the enclosure can be made as one piece with the metal substrate, or a fixing member (for example, an adhesive layer) is disposed between the enclosure and the metal substrate to assemble and position the enclosure on the metal substrate by way of the fixing member.

Each of the light emitting dies 32 in each trench 311 of the light emitting device can be of a different color to allow the entire light emitting device to emit different mixed light. When each light emitting die operates, the heat generated by the operation can be dissipated through the metal substrate to maintain the service life of the entire light emitting device. Furthermore, all the trenches can be connected in series or parallel by means of the wiring layer.

The prevent invention provides an improved structure of a package substrate, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

What is claimed is:

1. An improvement in a package substrate at least comprising:
   a metal substrate, on the surface of which an insulating layer is disposed, and the metal substrate is provided thereon with at least one trench that is recessed into the surface of the metal substrate through the insulating layer;
   more than one light emitting dies, which are secured in the trench;
   at least one wiring layer disposed on the insulating layer close to the trench;
   metal wires disposed between the light emitting dies and the wiring layer to form the electrical connection between the light emitting dies and the wiring layer; and
   packaging glue covering all the light emitting dies and the metal wires, wherein the packaging glue is transparent glue or fluorescent glue.

2. The improvement in a package substrate according to claim 1, wherein all the light emitting dies are electrically connected in series or parallel.

3. The improvement in a package substrate according to claim 1, wherein the sides of the trench are formed as inclined wall surfaces.

4. The improvement in a package substrate according to claim 1, wherein a polished reflective layer is disposed on the surface of the trench.

5. The improvement in a package substrate according to claim 4, wherein insulating paste is provided between the light emitting dies and the polished reflective layer.

6. The improvement in a package substrate according to claim 1, wherein the electrodes on the bottoms of the light emitting dies are directly electrically connected to the trench in a non-insulating manner.

7. The improvement in a package substrate according to claim 6, wherein conductive paste is provided between the light emitting dies and the trench.

8. The improvement in a package substrate according to claim 6, wherein a polished reflective layer is disposed on the surface of the trench, and conductive paste is provided between the light emitting dies and the polished reflective layer.

9. A light emitting device using a package substrate at least comprising:
   a metal substrate, which is provided thereon with a plurality of trenches, an insulating layer being disposed on the surface of the metal substrate but different from that of the trenches, the trenches being recessed into the surface of the metal substrate through the insulating layer, wherein a polished reflective layer is disposed on the surface of the trench, and at least one wiring layer being disposed on the insulating layer close to the trenches;

a plurality of light emitting dies, which are secured in the trenches, metal wires being disposed between the light emitting dies and the wiring layer;

at least one enclosure, which is disposed on the surface of the metal substrate and encloses all the trenches; and packaging glue, which is provided in the enclosure and covers all the light emitting dies.

10. The light emitting device according to claim 9, wherein all the light emitting dies are electrically connected in series or parallel.

11. The light emitting device according to claim 9, wherein the sides of the trenches are formed as inclined wall surfaces.

12. The light emitting device according to claim 9, wherein the enclosure is formed as one piece with the metal substrate or not.

13. The light emitting device according to claim 9, wherein the plurality of trenches are connected in series or parallel by means of the wiring layer.

14. The light emitting device according to claim 9, wherein the packaging glue is transparent glue or fluorescent glue.

15. The light emitting device according to claim 9, wherein insulating paste is provided between the light emitting dies and the polished reflective layer.

16. The light emitting device according to claim 9, wherein the electrodes on the bottoms of the light emitting dies are directly electrically connected to the trenches in a non-insulating manner.

17. The light emitting device according to claim 16, wherein a polished reflective layer is disposed on the surface of the trench, and conductive paste is provided between the light emitting dies and the polished reflective layer.

* * * * *